United States Patent
Kang et al.

(10) Patent No.: US 6,255,405 B1
(45) Date of Patent: Jul. 3, 2001

(54) LIGHT-ABSORBING POLYMERS AND APPLICATION THEREOF TO ANTI-REFLECTION FILM

(75) Inventors: Wen-Bing Kang; Yoshinori Nishiwaki; Ken Kimura; Syoko Matsuo; Hatsuyuki Tanaka, all of Shizuoka (JP)

(73) Assignee: Clariant International, Ltd., Muttenz (CH)

( * ) Notice: Subject to any disclaimer, the term of this patent is extended or adjusted under 35 U.S.C. 154(b) by 0 days.

(21) Appl. No.: 09/424,128

(22) PCT Filed: Mar. 15, 1999

(86) PCT No.: PCT/JP99/01244

§ 371 Date: Mar. 23, 2000

§ 102(e) Date: Mar. 23, 2000

(87) PCT Pub. No.: WO99/47571

PCT Pub. Date: Sep. 23, 1999

(30) Foreign Application Priority Data

Mar. 17, 1998 (JP) .................................................. 10-66626

(51) Int. Cl.$^7$ .......................... C08F 120/08; C08G 63/00
(52) U.S. Cl. ...................... 525/327.4; 528/176; 528/191; 528/195; 528/212; 528/219; 528/272; 525/327.6; 525/327.7; 525/437; 525/444
(58) Field of Search .................................... 528/176, 191, 528/195, 212, 219, 272; 525/327.4, 327.6, 327.7, 437, 447

(56) References Cited

U.S. PATENT DOCUMENTS

| | | | |
|---|---|---|---|
| 5,294,680 | * 3/1994 | Knors et al. ...................... | 525/327.4 |
| 5,576,359 | 11/1996 | Urano et al. ...................... | 523/400 |
| 5,677,112 | 10/1997 | Urano et al. ...................... | 430/325 |

FOREIGN PATENT DOCUMENTS

1996E/019    5/1998    (JP) .

OTHER PUBLICATIONS

Abstract for Japan Patent No. 10199789, Jul./1998.

Abstract for Japan Patent No. 7268036, Oct./1995.

* cited by examiner

*Primary Examiner*—Samuel A. Acquah
(74) *Attorney, Agent, or Firm*—Sangya Jain

(57) ABSTRACT

A high-performance anti-reflective coating which highly absorbs a given light, e.g., deep ultraviolet rays, tenaciously adheres to substrates upon coating formation, is satisfactory in covering, and eliminates the influence of standing waves in the production of integrated circuits; novel light-absorbing polymers for forming the anti-reflective coating; and a process for producing the polymers. One of the polymers is produced by esterifying a copolymer comprising carboxylic anhydride groups and/or dicarboxylic acid groups such as maleic acid as basic recurring units with a hydroxylated aromatic chromophore. The unreacted carboxylic acid groups or acid anhydride groups remaining in the esterified light-absorbing polymer may be amidated and/or imidized with an aminated aromatic compound. Each of these polymers is dissolved in an organic solvent comprising an alcohol, aromatic hydrocarbon, ketone, ester, or combination of these, and the solution is applied to a substrate and then baked to form an anti-reflective coating.

8 Claims, No Drawings

LIGHT-ABSORBING POLYMERS AND APPLICATION THEREOF TO ANTI-REFLECTION FILM

TECHNICAL FIELD

The present invention relates to a radiation absorbing polymer and application thereof to an anti-reflective coating and in particular to a radiation absorbing polymer suitable as a material for forming an anti-reflective coating in producing fine elements such as integrated circuit elements by photolithographic process, as well as to a method of producing the same, a film forming composition containing the radiation absorbing polymer and an anti-reflective coating therefrom.

BACKGROUND ART

In the field of manufacturing integrated circuit elements, miniaturization of processing size in lithographic process is proceeding in order to achieve higher degrees of integration, and in recent years the development of technology enabling fine processing in the submicron order is advancing. In this lithographic process, a resist is applied onto a substrate, and then a mask pattern is transferred to the resist by exposure to radiation and developed with a suitable developer to form a desired resist pattern. However, many substrates used in the field of manufacturing integrated circuit elements have high reflectivity, and there is a problem of standing waves based on the interference between exposure light and reflected light off a substrate, and another problem is that particularly when a substrate having uneven surface is used as a substrate to be coated with a resist, an exposure light passing through the resist layer is reflected off the substrate whereby the light reaches the resist portion which should not be exposed to the light, thus causing pattern defects or resulting in a failure to obtain a pattern having desired resolution or desired shapes.

To solve these problems, various methods have been proposed so far. The known methods include e.g. a method of dispersing, in a resist, a dye having absorption in the wavelength range of exposure light, a method of forming an anti-reflective coating consisting of an inorganic compound coating such as titanium nitride etc. on a substrate by CVD or vacuum deposition, a method of forming an anti-reflective coating by applying onto a substrate an organic polymer solution having a radiation absorbing dye dispersed or dissolved therein, and a method of forming a radiation absorbing coating by applying onto a substrate a radiation absorbing polymer having a chromophore bound chemically to the polymer.

Among these methods, the method of dispersing a radiation absorbing dye in a resist has problems such as reduction in resist sensitivity, thinning of the resist layer during development and sublimation of the dye during baking. On the one hand, the method of using an inorganic anti-reflective coating has various problems such as difficulty in accurate control of coating thickness, difficulty of forming a coating with uniform thickness, requirement for a special apparatus upon conducting vacuum deposition, poor adhesion to a resist film, and necessity of another dry etching process in order to transfer a pattern. Further, the method of dispersing a radiation absorbing dye in an anti-reflective coating has problems such as separation of the dye from the polymer upon forming an anti-reflective coating by spin coating, elution of the dye into a resist solvent, and sublimation of the dye into a resist film at the time of baking. Furthermore, some anti-reflective coatings using the organic substance described above, particularly containing a low-molecular dye dispersed in the polymer, fail to form a coating with uniform thickness on a substrate with uneven surface.

On the other hand, the method of using a radiation-absorbing polymer having a chromophore bound chemically to the polymer does not have such drawbacks, so this method has attracted attention in recent years. The method of forming an anti-reflective coating by use of a radiation absorbing polymer, and the radiation absorbing polymer material used in this method, are described in e.g. JP-A 6-75378, JP-A 6-118656, WO 9412912, U.S. Pat. No. 4,910,122 and U.S. Pat. No. 5,057,399. In production of LSI in recent years, deep ultraviolet rays (DUV) with a wavelength of 248 nm or less comes to be used for exposure of a photoresist to achieve high resolution, and in particular when a certain radiation of such short wavelength is used for exposure, an anti-reflective coating is essential to keep the good resolution and good pattern shape of a resist image to be formed. As the anti-reflective coating materials for i-line using a radiation absorbing polymer, anti-reflective coating materials, e.g. AZ®-BARLi® (Clariant Co.), which can form an anti-reflective coating with uniform thickness even on a substrate with uneven surface, that is, which is excellent in step coverage and other characteristics are known. But under the present circumstances, there is no anti-reflective coating material for DUV, which particularly has step coverage similar to or more than that of AZ®-BARLi® and is excellent in other properties such as radiation absorption characteristics, etching characteristics and adhesion to a substrate.

The object of the present invention is to provide an anti-reflective coating free of the problems in the prior art described above, that is, a coating which is excellent in step coverage, does not cause transfer and sublimation of a dye during heating, has a high anti-reflectivity effect, is also excellent in adhesion to a substrate, dry etching properties, thermostability and handling, and is capable of forming a high-resolution resist image excellent in pattern shape; a novel radiation absorbing polymer having a radiation absorbing dye bound chemically to a polymer chain thereof, which is used in said coating; a method of preparing the same; and a film forming composition containing said novel radiation absorbing polymer.

DISCLOSURE OF THE INVENTION

As a result of their eager study, the present inventors found that the problems described above can be solved by linking and introducing a specific radiation absorbing compound to a specific polymer chain, more desirably by selecting the type of the radiation absorbing compound, the amount thereof introduced into a polymer and the type of comonomer or by regulating the copolymerization ratio thereof, and the present invention was thereby completed.

That is, the present invention relates to a radiation absorbing polymer (first radiation absorbing polymer) comprising at least both a recurring units represented by formula 1 and a recurring units represented by formula 2:

(1)

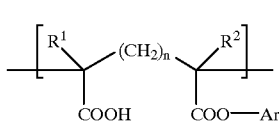

wherein $R^1$ and $R^2$ may be the same or different and each represent a hydrogen atom, an alkyl group or other organic groups, Ar represents an organic chromophore, and n is 0 or an integer of 1 or more;

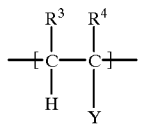

(2)

wherein $R^3$ and $R^4$ may be the same or different and each represent a hydrogen atom, a carboxyl group, an alkyl group or other organic groups, and Y represents a hydrogen atom, a substituted or non-substituted alkyl group, a substituted or non-substituted alkoxyl group, a halogen atom, —CN, an alkylcarbonyloxy group, an imide group, a substituted or non-substituted carbamoyl group, a substituted carbonyl group, a substituted or non-substituted oxycarbonyl group or a substituted or non-substituted phenyl group.

Further, the present invention relates to a method of preparing the first radiation absorbing polymer described above, wherein (a) a polymer comprising at least both at least one recurring unit selected from recurring units represented by formula 3-1 or 3-2 and a recurring unit represented by formula 2 above is reacted with (b) a compound containing a hydroxyl group represented by formula 4:

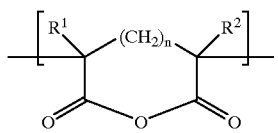

(3-1)

wherein $R^1$, $R^2$ and n have the same meanings as defined above;

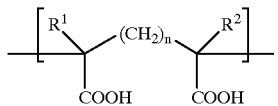

(3-2)

wherein $R^1$, $R^2$ and n have the same meanings as defined above;

(4)

wherein Ar has the same meaning as defined above.

Further, the present invention relates to a radiation absorbing polymer (second radiation absorbing polymer) comprising at least a recurring unit represented by formula 1 above, a recurring unit represented by formula 2 above, and a recurring unit represented by formula 5 and/or formula 6:

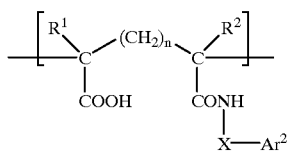

(5)

wherein $R^1$, $R^2$ and n have the same meanings as defined above, $Ar^2$ represents an organic chromophore bound to X via an oxygen atom, a nitrogen atom or a sulfur atom as necessary, and X represents a direct bond, a methylene group or a linear, branched or cyclic alkylene group containing at least 2 carbon atoms;

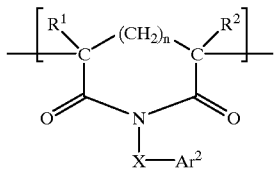

(6)

wherein $R^1$, $R^2$, $Ar^2$, X and n have the same meanings as defined above.

In the present invention, the organic chromophores represented by Ar and $Ar^2$ absorb radiation and these are preferably substituted or non-substituted, phenyl groups, heterocyclic groups or fused ring groups. In the present invention, Ar and $Ar^2$ may be the same or different. Substituents on the substituted or non-substituted phenyl groups include a nitro group, alkoxyl group, aryloxy group, hydroxyl group, alkylcarbonyl group, aromatic cyclic group (e.g. phenyl group or naphthyl group), and a vinyl group unsubstituted or substituted with a phenyl group or naphthyl group. Examples of such substituted or non-substituted phenyl groups include groups derived from the following:

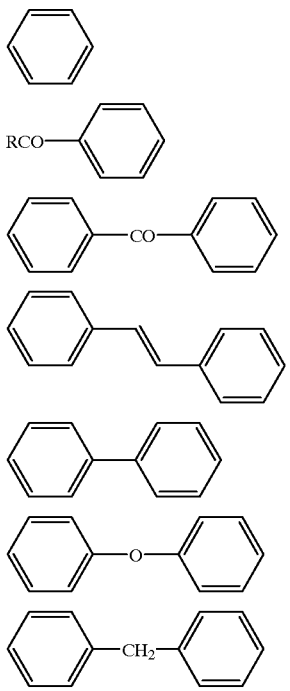

The heterocyclic groups and condensed ring groups include cyclic groups such as pyridine, thiophene, furan, quinoline, naphthalene, anthracene and phenanthrene shown below. These groups may also be substituted with an alkyl group, alkoxyl group, nitro group, halogen group, hydroxyl group etc.

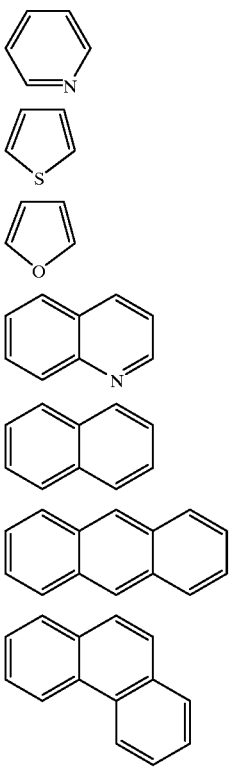

Further, the preset invention relates to a method of preparing the second radiation absorbing polymer, wherein a radiation absorbing polymer comprising at least a recurring unit represented by formula 1 above, a recurring unit represented by formula 2 above, and a recurring unit represented by formula 3-1 and/or formula 3-2 above is reacted with an aromatic compound containing an amino group represented by formula 7:

$$Ar^2-X-NH_2 \quad (7)$$

wherein $Ar^2$ and X have the same meanings as defined above.

Further, the present invention relates to a film forming composition and an anti-reflective coating comprising the first radiation absorbing polymer and/or the second radiation-absorbing polymer described above.

Hereinafter, the present invention is described in more detail, but the following description is not intended to limit the scope of the present invention.

The first radiation absorbing polymer of the present invention, as described above, is produced by reacting (a) a polymer having at least both at least one recurring unit selected from recurring units represented by formula 3-1 or 3-2 and a recurring unit represented by formula 2 with (b) a compound containing a hydroxyl group represented by formula 4 above. Production of the first radiation absorbing polymer is conducted generally by dissolving the starting polymer (a) and the hydroxyl group-containing compound (b) in a solvent and then esterifying a carboxyl group or an acid anhydride group in the starting polymer (a) with the hydroxyl-group containing compound (b) at raised temperatures. The number average molecular weight of the starting polymer is usually 300 to 10,000,000, and this starting polymer is preferably a polymer in which the recurring unit represented by formula 3-1 or 3-2 is 5 to 80 mol-% relative to the total recurring units while the recurring unit represented by formula 2 is 20 to 70 mol-% relative to the total recurring units, and the hydroxyl group-containing compound is used preferably in an amount of 5 to 70 mol-% relative to the total recurring units of formulae 3-1 and 3-2 in the polymer. Preferably, the first radiation absorbing polymer thus produced has a molecular weight of about 30,000 to 1,000,000 and contains at least 5 mol-% recurring unit of formula I relative to the total recurring units.

The monomer components forming the recurring unit represented by formula 3-1 or 3-2 constituting the starting polymer include e.g. dicarboxylic acids and acid anhydrides such as maleic acid, maleic anhydride and derivatives thereof, glutaric acid, glutaric anhydride and derivatives thereof. Among these, acid anhydrides are preferable, and maleic anhydride is particularly preferable.

The recurring unit represented by formula 2 is used for conferring good film formability, high radiation absorption, high etch rate, solubility in specific solvents, good storage stability, crosslinking (curing) properties or other preferable characteristics on the polymer. Typical examples of monomers for constituting the recurring unit represented by formula 2 include styrene, vinyl ether, acrylate, methacrylate, and derivatives thereof. Specific examples of preferable monomers for forming the recurring unit represented by formula 2 include methyl methacrylate, methyl acrylate, 2-hydroxyethyl methacrylate, ethyl methacrylate, 2-(methacryloyloxy)ethyl methacrylate, butyl methacrylate, t-butyl methacrylate, glycidyl methacrylate, methacrylic acid, acrylic acid, acrylonitrile, acrylamide, hydroxymethyl acrylamide, 2-isocyanatoethyl methacrylate, 4-acetoxystyrene, 3-methyl-4-hydroxystyrene, styrene, vinyl chloride, ethyl vinyl ether, butyl vinyl ether, isobutyl vinyl ether, cyclohexyl vinyl ether, methyl vinyl ether, maleimide, vinyl acetate, 2-isocyanatoethyl acrylate etc. Among these, styrene, methyl methacrylate, methacrylic acid, methyl acrylate, hydroxymethyl acrylamide, butyl methacrylate, t-butyl methacrylate, glycidyl methacrylate, methyl vinyl ether and butyl vinyl ether are preferable, and methyl vinyl ether and styrene are more preferable.

If the amount of the hydroxyl group-containing compound is less than an equimolar amount relative to the recurring units represented by formula 3-1 or 3-2 in producing the first radiation absorbing polymer, a part of the recurring units represented by formula 3-1 or 3-2 contained in the starting polymer remain unreacted in the first radiation absorbing polymer.

The starting polymer is preferably a maleic anhydride alkyl vinyl ether or styrene copolymer, particularly preferably a maleic anhydride/methyl vinyl ether copolymer represented by formula 12:

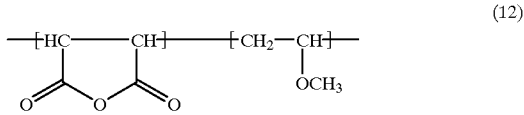

(12)

The number average molecular weight of the copolymer represented by formula 12 above is preferably 300 to 10,000,000, particularly preferably 10,000 to 3,000,000.

By reaction with the hydroxyl group-containing compound represented by formula 4 above, the recurring unit containing an acid anhydride group in formula 12 above forms the recurring unit represented by formula 13:

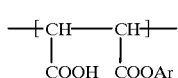
(13)

On the other hand, preferable examples of the hydroxyl group-containing compound represented by formula .4 are compounds represented by formula 8, 9 or 10:

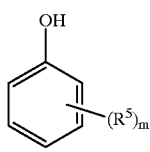
(8)

wherein $R^5$ represents an alkyl group, an alkoxyl group, a nitro group or other organic groups, and when m is 2 or more, respective $R^5$ groups may be the same or different, and m is 0 or an integer of 1 to 5;

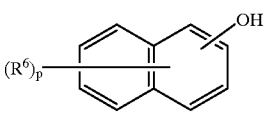
(9)

wherein $R^6$ represents an alkyl group, an alkoxyl group, a nitro group or other organic groups, and when p is 2 or more, respective $R^6$ groups may be the same or different, and p is 0 or an integer of 1 to 7;

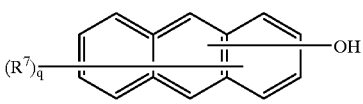
(10)

wherein $R^7$ represents an alkyl group, an alkoxyl group, a nitro group or other organic groups, and when q is 2 or more, respective $R^7$ groups may be the same or different, and q is 0 or an integer of 1 to 9.

Preferable examples of compounds represented by formulae 8 to 10 are the compounds (I) to (VI) shown below. When the first radiation absorbing polymer is used as the material of an anti-reflective coating, the compound represented by formula 4 should basically absorb radiation of predetermined wavelength, but as described below, when the first radiation absorbing polymer contains a recurring unit represented by formula 3-1 or 3-2, it is further converted into the second radiation absorbing polymer by reaction with the amino group-containing aromatic compound represented by formula 7, and when this amino group-containing aromatic compound absorbs radiation of predetermined wavelength, it is not necessarily required for the compound represented by formula 4 to absorb radiation of exposure wavelength, that is, radiation of predetermined wavelength.

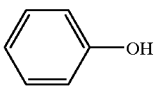
(I)

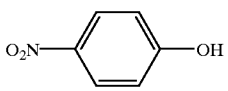
(II)

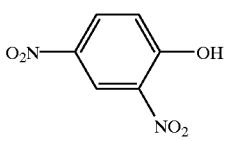
(III)

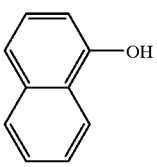
(IV)

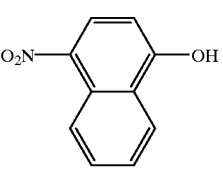
(V)

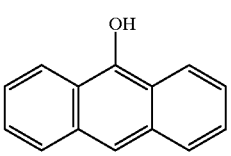
(VI)

Among the compounds represented by formula 4, the following compounds are preferably used in the relationship with absorption wavelength: the compound of formula (III) is used for i-line (wavelength; 365 nm), the compound of formula (VI) is used for a KrF excimer laser (248 mm), and the compound of formula (I) is used for an ArF excimer laser (193 nm). Production of the first radiation-absorbing polymer is not limited to the method described above, and as a matter of course, the first radiation-absorbing polymer can also be produced by copolymerization of monomers necessary for constituting the respective recurring units of the radiation-absorbing polymer.

Further, the second radiation absorbing polymer of the present invention contains the recurring unit represented by formula 5 or 6 in addition to the recurring units of the first radiation absorbing polymer in order to improve the characteristics of the first polymer. The second radiation absorbing polymer of the present invention is produced usually by allowing a carboxyl group or an acid anhydride group in the recurring unit having a dicarboxylic acid group or an acid anhydride group still not reacting with the hydroxyl group-containing compound in the first radiation absorbing polymer to react with the aromatic compound containing an amino group represented by formula 7 thereby further introducing a radiation absorbing group into the main chain of the polymer through an amide and/or imide linkage.

$Ar^2—X—NH_2$ (7)

wherein $Ar^2$ and X have the same meanings as defined above.

One of preferable examples of the amino group-containing aromatic compound represented by formula 7 is a compound represented by formula 14:

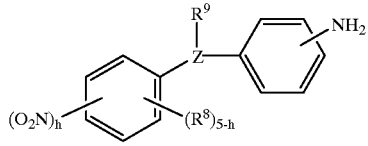
(14)

wherein Z represents an oxygen atom, a nitrogen atom or a sulfur atom, $R^9$ is present in the only case where Z is a nitrogen atom, whereupon $R^9$ represents a hydrogen atom, an alkyl group or other organic groups, h is an integer of 1 to 4, R8 represents a hydrogen atom, a halogen atom, a hydroxyl group, an amino group, a sulfonic acid group or other organic groups, and when a plurality of $R^8$ groups are present on the ring, these groups may be the same or different, or $R^8$ groups may be combined with one another to form an aliphatic or aromatic ring.

Among the compounds represented by formula 14, the compounds represented by formula 11 wherein Z is a nitrogen atom and $R^9$ is a hydrogen atom are particularly preferable.

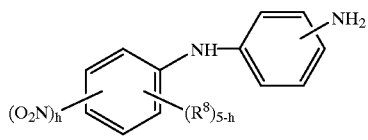
(11)

wherein $R^8$ and h have the same meanings as defined above.

Particularly preferable examples of the compounds represented by formula 7 above are the following compounds (VII) to (XIV):

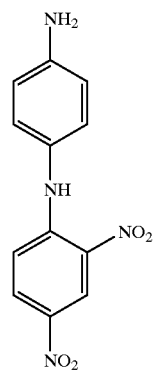
(VII)

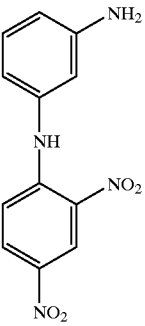
(VIII)

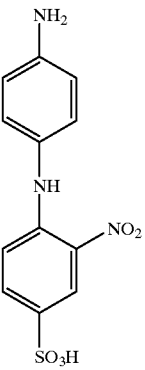
(IX)

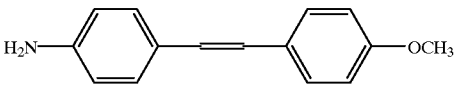
(X)

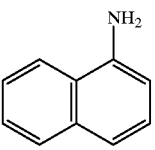
(XI)

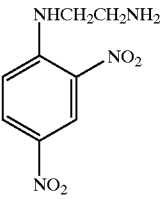
(XII)

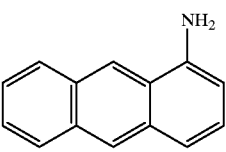
(XIII)

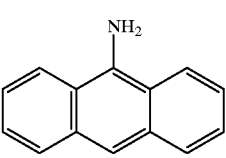
(XIV)

Among these, the aminoanthracene strongly absorbs radiation from a KrF excimer laser (248 mm) and thus it is preferable as a material of an anti-reflective coating for the KrF excimer laser. However, in the present invention, the compound containing a reactive amino group may be a compound improving not only the radiation absorption characteristics of a polymer formed but also polymer performance such as film formability etc., and for example, when Ar has absorption at a predetermined wavelength, it is not necessarily required to use a compound having an absorption range at the predetermined wavelength as the amino group-containing compound. Further, production of the second radiation absorbing polymer is not limited to the method described above, and as a matter of course, the second radiation absorbing polymer may also be produced by copolymerization of monomers necessary for constituting the respective recurring units of the second radiation absorbing polymer.

The radiation absorbing polymer of the present invention when used as an anti-reflective coating in producing integrated circuit elements can become a polymer having an absorption wavelength adjusted to a exposure wavelength for resist ranging from about 180 nm to about 450 nm by suitably combining the hydroxyl group-containing compound of formula 4 above with the amino group-containing aromatic compound of formula 7. Further, a plurality of compounds of formula 4 or 7 each having a different absorption wavelength range can be used to confer absorption of different exposure wavelengths on the polymer, so the radiation absorbing polymer of the present invention is very useful as a material of an anti-reflective coating.

The first and/or second radiation absorbing polymer described above is dissolved in a suitable solvent to form a film forming composition, and preferable solvents for forming this film forming composition include γ-butyrolactone, cyclohexanone, dimethylacetamide, dimethylformamide, dimethyl sulfoxide, N-methyl pyrrolidone, ethyl lactate (EL), methoxy propanol (PGME), propylene glycol monomethyl ether acetate (PGMEA), or mixtures thereof. However, the solvent used for forming the film forming composition of the present invention is not limited to these specifically enumerated solvents. Among these, particularly preferable solvents are γ-butyrolactone, cyclohexanone, EL, PGME, and a mixed solvent of PGME and PGMEA. In addition, the concentration of the radiation absorbing polymer in the film forming composition is usually 20% by weight or less.

When the film forming composition is produced by using the radiation absorbing polymer of the present invention, a surface active agent and silane-based leveling agent can be added in a small amount in it to adjust adhesion and coating characteristics onto a substrate. Further, low-molecular compounds or polymer materials, for example, a crosslinking agent, a crosslinking auxiliary or other radiation absorbing compounds can also be added as necessary.

The film forming composition of the present invention is used mainly for forming a bottom anti-reflective coating upon producing an integrated circuit, but the purpose of its use is not limited to the field of manufacturing of integrated circuit elements. As described above, the hydroxyl group-containing compound represented by formula 4 and the amino group-containing aromatic compound represented by formula 7 are suitably combined whereby a radiation absorbing polymer that can well absorb radiation having peaks in the range of 180 nm to 450 nm used for exposure to resists can be obtained, and because of the radiation absorption of this light absorbing polymer, the reflection of exposure radiation off a substrate is prevented, and a defect-free resist pattern with high resolution can be formed.

The anti-reflective coating of the present invention is formed by applying the film coating composition comprising the radiation absorbing polymer of the present invention onto a substrate by spin coating, cast coating or roller coating as the thickness of its dried film on the substrate is e.g. 500 to 50,000 angstrom and then baking it at suitable temperatures. The baking temperature is, for example, 90 to 250° C. or so, preferably 180 to 220° C. The substrate on which the anti-reflective coating has been formed is usually coated with a photoresist in predetermined thickness and then pre-baked to form a photoresist coating thereon. Typical examples of solvents for the photoresist include EL, PGMEA and ketones, but the solvent for the photoresist is not limited to these solvents. The photoresist whether positive or negative can be used. The pre-baking temperature is considerably varied depending on the photoresist used, and usually it is in the range of about 30 to 200° C. Further, exposure radiation for the photoresist can be selected from visible light, ultraviolet rays, deep ultraviolet rays, X-rays and electron beams, depending on the photoresist used. The radiation absorbing polymer used in the anti-reflective coating is selected from the polymer which has an absorption range in the exposure wavelength range used for the exposure described above. After the exposure, after-baking is conducted as necessary, followed by development with a developer to form a resist pattern. Then, dry etching of the anti-reflective coating is conducted using gas plasma such as oxygen plasma. A resist pattern for processing or treating the substrate is thereby formed. The developer used may be any one known in the art, such as alkaline aqueous solutions or aqueous alkali solutions in which a metal hydroxide, organic amine or the like is dissolved.

BEST MODES FOR CARRYING OUT THE INVENTION

Hereinafter, the present invention is described in more detail by reference to the Examples and Comparative Examples, which however are not intended to limit the present invention.

EXAMPLE 1

(Polymer synthesis 1)

7.2 g of 1-naphthol was dissolved in 300 g of cyclohexanone, and 17.4 g of commercially available poly (maleic anhydride-co-methylvinyl ether) powder (18459-4, manufactured by Aldrich Co.) was added gradually thereto at room temperature under stirring. After completion of the addition, the reaction mixture was heated up to 140° C. and reacted at this temperature for 4 hours, and the reaction solution was cooled down to 100° C. or less. 13.7 g of N-(2,4-dinitrophenyl) phenylene diamine (Disperse Yellow 9) was added thereto and then the reaction solution was heated at 140° C. for about 4 hours. Thereafter, the reaction solution was cooled to room temperature, and the reaction solution was precipitated with isopropanol. The precipitate was collected by filtration and dried in vacuum to obtain 31 g of polymer solid. GPC analysis using lithium chloride-added dimethylformamide as a mobile phase and polyethylene oxide as a standard substance revealed that the obtained polymer had a weight average molecular weight (Mw) of 59,000, a number average molecular weight (Mn) of 23,000, and a polydispersity (Mw/Mn) of 2.56. The k valueof the film formed from the polymer solution was about 0.28 at 248 nm, as measured by a spectral ellipsometer.

EXAMPLE 2

(Polymer synthesis 2)

9.7 g of 9-hydroxyanthracene was dissolved in 320 g of cyclohexanone, and 17.4 g of commercially available poly (maleic anhydride-co-methylvinyl ether) powder (18459-4, manufactured by Aldrich Co.) was added gradually thereto at room temperature under stirring. After completion of the addition, the reaction mixture was heated up to 140° C. and reacted at this temperature for 4 hours, and the reaction solution was cooled down to 100° C. or less. 13.7 g of N-(2,4-dinitrophenyl)phenylene diamine (Disperse Yellow 9) was added thereto and then the reaction solution was heated at 140° C. for about 4 hours. Thereafter, the reaction solution was cooled to room temperature, and the reaction solution was precipitated with isopropanol in a usual manner. The precipitate was dried in vacuum to obtain 33 g of polymer solid. GPC analysis using lithium chloride-added dimethylformamide as a mobile phase and polyethylene oxide as a standard substance revealed that the obtained polymer had a weight average molecular weight (Mw) of 54,000, a number average molecular weight (Mn) of 21,000, and a polydispersity (Mw/Mn) of 2.57. The k value of the film formed from the polymer solution was about 0.55 at 248 nm, as measured by a spectral ellipsometer.

EXAMPLE 3

(Polymer synthesis 3)

4.7 g of phenol was dissolved in 280 g of cyclohexanone, and 17.4 g of commercially available poly(maleic anhydride-co-methylvinyl ether) powder (18459-4, manufactured by Aldrich Co.) was added gradually thereto at room temperature under stirring. After completion of the addition, the reaction mixture was heated up to 140° C. and reacted at this temperature for 4 hours, and the reaction solution was cooled down to 100° C. or less. 9.65 g of 1-aminoanthracene was added thereto and then the reaction solution was heated at 140° C. for about 4 hours. Thereafter, the reaction solution was cooled to room temperature, and the reaction solution was precipitated with isopropanol in a usual manner. The obtained precipitate was dried in vacuum to obtain 25 g of polymer solid. GPC analysis using lithium chloride-added dimethylformamide as a mobile phase and polyethylene oxide as a standard substance revealed that the obtained polymer had a weight average molecular weight (Mw) of 50,000, a number average molecular weight (Mn) of 21,000, and a polydispersity (Mw/Mn) of 2.38. The k value of the film formed from the polymer solution was about 0.49 at 248 nm, as measured by a spectral ellipsometer.

EXAMPLE 4

(Experiment for comparing coverage)

The polymers obtained in Examples 1 to 3 were added at a concentration of about 3% in cyclohexane respectively and stirred at room temperature to be dissolved completely. The respective solutions were filtered through a 0.1 µm filter, and the resulting filtrates were designated coating solutions A, B and C, respectively. On the other hand, resist patterns of 1.0 µm in height were formed on a silicon wafer at pattern intervals of 1 µm, 3 µm and 5 µm, and platinum was vapor-deposited thereon. A plurality of these silicon wafers with uneven surface were prepared and spin-coated at 3,000 rpm with the above coating solutions A, B and C and an AZ®-BARLi® solution (manufactured by Clariant Co., hereinafter the same) as comparative examples. After this the coated wafers were baked at 200° C. for 60 seconds on a hot plate to form 1,000 angstrom anti-reflective coatings on the wafers. As the result of the pattern observation of each specimen under a scanning electron microscope (SEM), it was found that the anti-reflective coatings obtained from the polymers of the invention exhibit similar coverage properties to those of the film of AZ®-BARLi® or slightly improved coverage properties as compared with the film of AZ®-BARLi®.

EXAMPLE 5

(Elution experiment of anti-reflective coatings after baking into resist solvents)

The coating solutions A, B and C obtained in Example 4 above were applied respectively onto silicon wafers and then baked at 160° C., 180° C., 200° C. and 220° C. to form films thereon, and resist solvents (MEK, EL, PGMEA and PGME) and a developer (2.38 wt % aqueous solution of tetramethyl ammonium hydroxide (TMAH)) were dropped respectively on the films, and after 60 seconds, the solvents or solutions on the films were wiped off and the reduction of the film thickness was examined. As a result, it was confirmed that the anti-reflective coatings of the present invention show no reduction of film thickness if baked at 200° C. or more. Accordingly, it could be confirmed that the anti-reflective coatings prepared at a suitable baking temperature from the anti-reflective coating material of the present invention did not change at the time of coating or development of the resist film.

EXAMPLE 6

(Experiment of testing resist pattern)

Each of the coating solutions obtained in Example 4 above was applied onto a silicon wafer so that a film having 60 nm in thickness was formed thereon after baking at 220° C. for 60 seconds. Thereafter, AZ® DX2034P, a resist for deep ultraviolet ray (DUV) manufactured by Clariant Co. was applied onto it so that a film having 0.75 µm in thickness was formed after pre-baking at 90° C. for 60 seconds. Then, the wafer was exposed to radiation by means of DUV stepper EX10B (exposure wavelength: λ=248 nm) from Nikon Corporation, then subjected to post-exposure bake at 105° C. for 90 seconds and developed with 2.38 wt % aqueous TMAH. Observation of the cross section of each of the thus obtained resist patterns under SEM revealed that the anti-reflective coatings of the present invention did not have any compatible layer with the resist film, and good resist patterns without having any influence, on the profile of the resist pattern, of standing waves generated by reflection off the substrate were formed.

Further, AZ®-BARLi® was also subjected to the same experiment under the same conditions as above to form a resist pattern by using AZ® DX2034P. Observation of the cross section of each of the thus obtained resist patterns under SEM revealed that there existed some standing waves on the resist pattern and considerable footing of the resist. It was thus found that the anti-reflective coating material of the present invention was more suitable for the DUV resist than AZ®-BARLi®.

EXAMPLE 7

(Experiment of comparing etchability)

Anti-reflective coating films formed from the coating solutions obtained in Example 4 above and an anti-reflective coating film formed from AZ®-BARLi® as the Comparative Example, each having the same film thickness, were baked at 200° C., and they were subjected to an etching comparative test using a dry etching apparatus. As a result, it was found that the polymer films of the present invention have the same degree of etch rate as that of AZ®-BARLi® and some of the films of the present invention exhibited somewhat faster etch rate than that of AZ®-BARLi®.

EFFECT OF THE INVENTION

As described above, the radiation absorbing polymer of the present invention has a excellent coverage property, good absorption for specific wavelength radiation such as deep ultraviolet rays, good adhesion to a substrate, and easy film formation. Further, this radiation absorbing polymer can be easily produced, and it can form a radiation absorbing polymer having absorption characteristics in a desired absorption range by suitably changing a combination of a hydroxyl group-containing compound and an amino group-containing aromatic compound to be introduced into the polymer main chain, and one kind of composition containing the polymer can serve as an anti-reflective coating material toward a plurality of radiations. Further, a film forming composition containing this radiation absorbing polymer is applied to form a coating and then the coating is heated at suitable temperatures to be made insoluble in solvents or developers for resist, so an anti-reflective coating which is not dissolved during formation or development of a resist film can be formed. In addition it can be easily removed by dry etching. Thus the radiation absorbing polymer of the present invention possesses preferable film characteristics in photolithography.

INDUSTRIL APPLICABILITY

As described above, the radiation absorbing polymer of the present invention is used preferably as a radiation absorbing composition and a radiation absorbing coating, in particular an anti-reflective coating upon producing integrated circuit elements.

What is claimed is:

1. A radiation absorbing polymer comprising at least both a recurring unit represented by formula 1 and a recurring unit represented by formula 2:

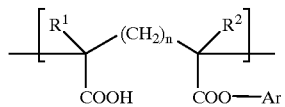

(1)

wherein
$R^1$ and $R^2$ may be the same or different and each represent a hydrogen atom, an alkyl group or other organic groups, Ar represents an organic chromophore, and n represents 0 or an integer of 1 or more;

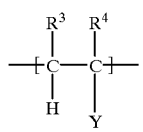

(2)

wherein
$R^3$ and $R^4$ may be the same or different and each represent a hydrogen atom, an alkyl group, a carboxyl group or other organic groups, and Y represents a hydrogen atom, a substituted or non-substituted alkoxyl group, a substituted or non-substituted alkyl group, a halogen atom, —CN, an alkylcarbonyloxy group, an imide group, a substituted or non-substituted carbamoyl group, a substituted carbonyl group, a substituted or non-substituted oxycarbonyl group or a substituted or non-substituted phenyl group.

2. A method of preparing a polymer described in claim 1 by esterifying a polymer comprising at least both a recurring unit represented by formula 2 and at least one selected from recurring units represented by formula 3-1 or 3-2, with a compound containing a hydroxyl group represented by formula 4:

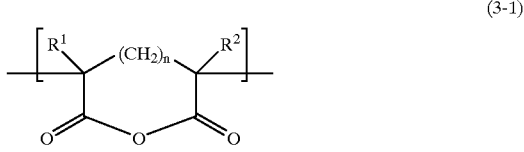

(3-1)

wherein
$R^1$ and $R^2$ may be the same or different and each represent a hydrogen atom, an alkyl group or other organic groups, and n represents 0 or an Integer of 1 or more,

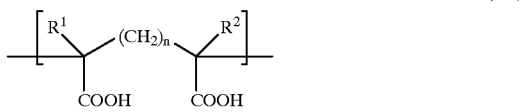

(3-2)

wherein
$R^1$, $R^2$ and n have the same meanings as defined above;

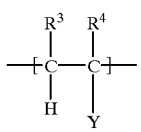

(2)

wherein
$R^3$ and $R^4$ may be the same or different and each represent a hydrogen atom, a carboxyl group, an alkyl group or other organic groups, and Y represents a hydrogen atom, a substituted or non-substituted alkoxyl group, a substituted or non-substituted alkyl group, a halogen atom, —CN, an alkylcarbonyloxy group, an imide group, a substituted or non-substituted carbamoyl group, a substituted carbonyl group, a substituted or non-substituted oxycarbonyl group or a substituted or non-substituted phenyl group;

Ar—OH (4)

wherein
Ar represents an organic chromophore.

3. A radiation absorbing polymer comprising at least a recurring unit represented by formula 1, a recurring unit represented by formula 2 and a recurring unit represented by formula 5 or 6:

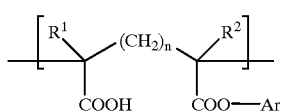

(1)

wherein
R$^1$ and R$^2$ may be the same or different and each represent a hydrogen atom, an alkyl group or other organic groups, Ar represents an organic chromophore, and n represents 0 or an integer of 1 or more;

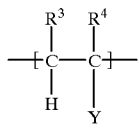

(2)

wherein
R$^3$ and R$^4$ may be the same or different and each represent a hydrogen atom, a carboxyl group, an alkyl group or other organic groups, and Y represents a hydrogen atom, a substituted or non-substituted alkoxyl group, a substituted or non-substituted alkyl group, a halogen atom, —CN, an alkylcarbonyloxy group, an imide group, a substituted or non-substituted carbamoyl group, a substituted carbonyl group, a substituted or non-substituted oxycarbonyl group or a substituted or non-substituted phenyl group;

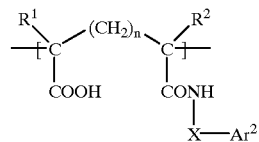

(5)

wherein
R$^1$, R$^2$ and n have the same meanings as defined above, Ar$^2$ represents an organic chromophore bonded to X via an oxygen atom, a nitrogen atom or a sulfer atom as necessary, and X represents a direct bond, a methylene group or a linear, branched or cyclic alkylene group containing at least 2 carbon atoms;

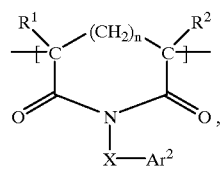

(6)

wherein
R$^1$, R$^2$, Ar$^2$, X and n have the same meanings as defined above.

4. A method of preparing a polymer described in claim 3 by reacting a radiation absorbing polymer comprising at least a recurring unit represented by formula 1, a recurring unit represented by formula 2 and a recurring unit represented by formula 3-1 or 3-2 with an aromatic compound containing an amino group represented by formula 7:

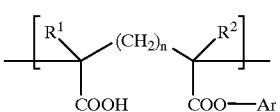

(1)

wherein
R$^1$ and R$^2$ may be the same or different and each represent a hydrogen atom, an alkyl group or other organic groups, Ar represents an organic chromophore, and n represents 0 or an integer of 1 or more;

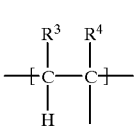

(2)

wherein
R$^3$ and R$^4$ may be the same or different and each represent a hydrogen atom, a carboxyl group, an alkyl group or other organic groups, and Y represents a hydrogen atom, a substituted or non-substituted alkoxyl group, a substituted or non-substituted alkyl group, a halogen atom, —CN, an alkylcarbonyloxy group, an imide group, a substituted or non-substituted carbamoyl group, a substituted carbonyl group, a substituted or non-substituted oxycarbonyl group or a substituted or non-substituted phenyl group;

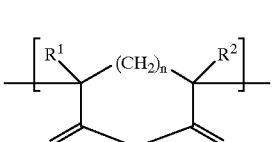

(3-1)

wherein
R$^1$, R$^2$ and n have the same meanings as defined above;

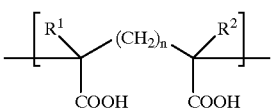

(3-2)

wherein
R$^1$, R$^2$ and n have the same meanings as defined above,

Ar$^2$—X—NH$_2$   (7)

wherein
Ar$^2$ represents an organic chromophore bonded to X via an oxygen atom, a nitrogen atom or a sulfur atom as necessary, and X represents a direct bond, a methylene group, or a linear, branched or cyclic alkylene group containing at least 2 carbon atoms.

5. The method of preparing a radiation absorbing polymer described in claim 2, wherein the compound containing a hydroxyl group represented by formula 4 is a compound represented by formula 8, 9 or 10:

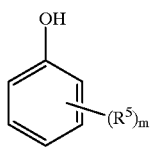
(8)

wherein $R^5$ represents an alkyl group, an alkoxyl group, a nitro group or other organic groups and when a plurality of $R^5$ groups are present on the ring, these groups may be the same or different, and m represents 0 or an integer of 1 to 5;

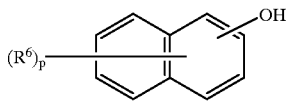
(9)

wherein $R^6$ represents an alkyl group, an alkoxyl group, a nitro group or other organic groups and when a plurality of $R^6$ groups are present on the ring, these groups may be the same or different, and p represents 0 or an integer of 1 to 7;

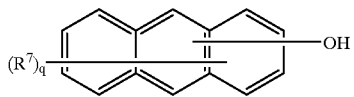
(10)

wherein $R^7$ represents an alkyl group, an alkoxyl group, a nitro group or other organic groups and when a plurality of $R^7$ groups are present on the ring, these groups may be the same or different, and q represents 0 or an integer of 1 to 9.

6. The method of preparing a radiation absorbing polymer described in claim 4, wherein the aromatic compound containing an amino group represented by formula 7 is a compound represented by formula 11:

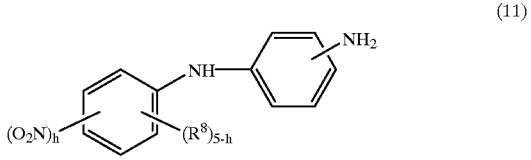
(11)

wherein $R^8$ represents a hydrogen atom, a halogen atom, a hydroxyl group, an amino group, a sulfonic acid group or other organic groups and when a plurality of $R^8$ groups are present on the ring, these groups may be the same or different, or $R^8$ groups may be combined with one another to form an aliphatic or aromatic ring, and h is an integer of 1 to 4.

7. A film forming composition containing a radiation absorbing polymer described in claim 1 and/or a radiation absorbing polymer described in claim 3.

8. An anti-reflective coating containing a radiation absorbing polymer described in claim 1 and/or a radiation absorbing polymer described in claim 3.

* * * * *